US010088534B2

(12) United States Patent
Saint-Jalmes et al.

(10) Patent No.: US 10,088,534 B2
(45) Date of Patent: Oct. 2, 2018

(54) MEASURING METHOD AND DEVICE FOR MAGNETIC RESONANCE APPLICATIONS

(71) Applicants: UNIVERSITE CLAUDE BERNARD LYON I, Villeurbanne (FR); INSTITUT NATIONAL DES SCIENCES APPLIQUEES DE LYON, Villeurbanne (FR); CENTRE NATIONAL DE LA RECHERCHE SCIENTIFIQUE, Paris (FR); UNIVERSITE DE RENNES 1, Rennes (FR)

(72) Inventors: Hervé Saint-Jalmes, Rennes (FR); Olivier Beuf, Montanay (FR)

(73) Assignees: UNIVERSITE CLAUDE BERNARD LYON I, Villeurbanne (FR); INSTITUT NATIONAL DES SCIENCES APPLIQUEES DE LYON, Villeurbanne (FR); CENTRE NATIONAL DE LA RECHERCHE SCIENTIFIQUE, Paris (FR); UNIVERSITE DE RENNES 1, Rennes (FR)

( * ) Notice: Subject to any disclaimer, the term of this patent is extended or adjusted under 35 U.S.C. 154(b) by 473 days.

(21) Appl. No.: 14/766,797

(22) PCT Filed: Feb. 12, 2014

(86) PCT No.: PCT/FR2014/050276
§ 371 (c)(1),
(2) Date: Aug. 10, 2015

(87) PCT Pub. No.: WO2014/125214
PCT Pub. Date: Aug. 21, 2014

(65) Prior Publication Data
US 2015/0377988 A1 Dec. 31, 2015

(30) Foreign Application Priority Data

Feb. 14, 2013 (FR) .................................... 13 51285

(51) Int. Cl.
*G01V 3/00* (2006.01)
*G01R 33/24* (2006.01)
(Continued)

(52) U.S. Cl.
CPC .......... *G01R 33/243* (2013.01); *G01R 33/24* (2013.01); *G01R 33/288* (2013.01); *G01R 33/34* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS 4,761,612 A 8/1988 Holland et al.
2004/0199067 A1* 10/2004 Bock .................. G01R 33/0322
600/411

(Continued)

OTHER PUBLICATIONS

Benjamin Emanuel Dietrich et al., "A stand-alone system . . . RF sequence monitoring", Proceedings of the International Society for Magnetic Resonance in Medicine, vol. 20, Apr. 21, 2012, p. 700, XP055081665.
(Continued)

*Primary Examiner* — Huy Q Phan
*Assistant Examiner* — Raul Rios Russo
(74) *Attorney, Agent, or Firm* — Clark & Brody

(57) ABSTRACT

A measurement device for magnetic resonance applications includes, in a measurement case: a first sensor for measuring radiofrequency magnetic fields; a second sensor for mea-
(Continued)

suring magnetic field gradients; and a third sensor for measuring the radiofrequency electric field; and a stage for converting the electric signals delivered by the different measurement sensors into light signals. The device also in a controller for controlling and processing the signals, connected to the stage for conditioning the measurement case via a beam for transmitting light signals. The controller includes a stage for converting light signals into electric signals delivered by the sensors.

11 Claims, 4 Drawing Sheets

(51) Int. Cl.
G01R 33/28 (2006.01)
G01R 33/34 (2006.01)
G01R 33/385 (2006.01)
G01R 33/54 (2006.01)
G01R 33/565 (2006.01)

(52) U.S. Cl.
CPC .......... *G01R 33/385* (2013.01); *G01R 33/54* (2013.01); *G01R 33/5659* (2013.01); *G01R 33/56572* (2013.01); *G01R 33/56518* (2013.01)

(58) Field of Classification Search
CPC .......... G01R 33/4826; G01R 33/4828; G01R 33/483; G01R 33/4831; G01R 33/4833; G01R 33/4835; G01R 33/4836; G01R 33/4838
USPC ................................. 324/300–322
See application file for complete search history.

(56) References Cited

U.S. PATENT DOCUMENTS

| | | | |
|---|---|---|---|
| 2005/0270030 A1* | 12/2005 | Takai ................. | G01R 33/3854 324/318 |
| 2010/0138192 A1* | 6/2010 | Min ..................... | A61N 1/3718 703/1 |
| 2010/0191095 A1* | 7/2010 | Felblinger ............. | A61B 5/04 600/411 |
| 2012/0139541 A1 | 6/2012 | Weiss et al. | |
| 2014/0077800 A1* | 3/2014 | Frauenrath .......... | A61B 5/0265 324/306 |

OTHER PUBLICATIONS

Rudolf Fritz Fischer et al., "Monitoring and compensating . . . steady-state free precession", Magnetic Resonance in Medicine, Feb. 6, 2013, XP055081664.

Barmet C. et al., "Spatiotemporal Magnetic Field Monitoring for MR", Magnetic Resonance in Medicine, vol. 60, Jul. 1, 2008, pp. 187-197, XP002657138.

Signe J. Vannesjo et al., "Gradient system characterization . . . dynamic field camera", Magnetic Resonance in Medicine, vol. 69, No. 2, Apr. 12, 2012, pp. 583-593, XP055081659.

Joseph P. M. et al., "Electric field measurements in cylindrical imaging coils", Journal of Magnetic Resonance, vol. 75, No. 2, Nov. 1, 1987, pp. 199-212, XP023960493.

Howard I. Bassen et al., "Electric Field Probes—A Review", IEEE Transactions on Antennas and Propagation, vol. AP-31, No. 5, Sep. 1, 1983, pp. 710-718, XP001389022.

Senaj Viliam et al., "Inductive measurement of . . . magnetic resonance imaging", Review of Scientific Instruments, vol. 69, No. 6, Jun. 1, 1988, pp. 2400-2405, XP012036628.

* cited by examiner

MEASURING METHOD AND DEVICE FOR MAGNETIC RESONANCE APPLICATIONS

The present invention relates to the technical field of magnetic resonance and in particular to NMR (Nuclear Magnetic Resonance), MRI (Magnetic Resonance Imaging) and/or MRS (Magnetic Resonance Spectroscopy) apparatuses.

The present invention more particularly relates to the field of instruments or devices suitable for measuring radiofrequency electromagnetic fields, magnetic field gradients as well as the static magnetic field applied to an object to be studied by magnetic resonance.

NMR, MRI and/or MRS apparatuses are complex instruments which apply radiofrequency magnetic fields and magnetic field gradients for generating images and/or spectra of a region of the object or of the body to be studied. These fields are generated and organized at a rate of time sequences, the theoretical time diagram of which is described in the literature for generic families of sequences.

However, the variability of these sequences is extreme and depends on the manufacturers of these apparatuses. Except for obvious information (repetition time, echo time, sequence type), the details of the sequences used are not known. Thus, it is quite difficult to specifically determine the occurrences, the durations and the amplitudes of the fields used. However, this information is indispensable to know in order to quantify the collected signals and therefore the obtained images. In addition to the fields mentioned above, the generation of the excitation radiofrequency magnetic field implies the existence of an electric field at the same frequency which may be of a larger amplitude and potentially dangerous for the patient. Its measurement is therefore also valuable. Indeed, the more the intensity of the magnetic field of the MRI apparatuses increases and consequently the working frequency, the more energy deposition in the patient also increases. Observance of standard limits becomes essential. Measurements of the SAR (Specific Absorption Rate) is thus conducted continuously in clinical MRI apparatuses. Again the result of this measurement is not directly accessible to the user.

Moreover, even when the specific time diagram of the sequence is well defined and known to the user of the apparatus, the generated fields do not exactly follow the control. Indeed, diverse imperfections affect the generation of these fields. The spatial uniformity of the radiofrequency field and/or the linearity of the magnetic field gradients are imperfect. The switching of the gradients also causes generation of eddy currents which are detrimental to the quality of the spatial coding of the information. Also, mechanical vibrations of the gradient coils or further imbalances between the gradient coils may cause distortion of this spatial coding. If the Cartesian sweeps of the Fourier plane remain quite resistant to these imperfections, the non-Cartesian sweeps (for example spirally) which are increasingly used for reducing the acquisition times, are very sensitive to these defects. Therefore it becomes indispensable to measure specifically the trajectories actually followed in the Fourier plane of the image during these sweeps in order to take them into account for reconstructing the images. Knowledge of these trajectories again requires the measurement of the variable magnetic fields mentioned above.

In order to access this information, one of the methods used amounts to connecting measurement instruments (oscilloscope) in the technical room to various radiofrequency and gradient amplifiers on control plugs provided for this purpose. This supposes significant technical competence on the one hand and having suitable measurement apparatuses and connectors as well as connecting methods. The gains of the various elements should be provided by the manufacturer of the apparatus. Further, the measurement of the currents does not correspond to the exact image of the fields generated by these currents in the magnet.

In the state of the art, from the publication of BENJAMIN EMANUEL DIETRICH ET AL.: "A stand-alone system for concurrent gradient and RF sequence monitoring," PROCEEDINGS OF THE INTERNATIONAL SOCIETY FOR MAGNETIC RESONANCE IN MEDICINE, 20TH ANNUAL MEETING AND EXHIBITION, MELBOURNE, AUSTRALIA, 5-11 May 2012, Vol. 20, Apr. 21, 2012, page 700, XP055081665, it is known that a portion of the magnetic fields applied to the object to be examined may be measured and viewed. After all in this technique, the measurement is based on the NMR phenomenon and therefore each sensor contains a sample having protons capable of generating an NMR signal once they are excited. Therefore, the question is to associate with each sensor, a complete NMR spectrometer comprising expensive and complex means for emission and reception of radiofrequencies. Moreover, in order to measure magnetic field gradients in the three directions of space, sensors (six in number) have to be placed pairwise. This measurement system is therefore substituted for the patient or object to be examined. Finally, the measurement of the radiofrequency fields is indirect and the radiofrequency electric field E is not measured.

The present invention therefore aims at finding a remedy to the drawbacks of the prior art by providing a measurement apparatus for magnetic resonance applications, suitable for simply and reliably measuring the radiofrequency electromagnetic fields and the magnetic field gradients actually applied to an object to be examined by magnetic resonance.

In order to attain such a goal, the measurement device for magnetic resonance applications, including three measurement axes corresponding to the axis of a main magnetic field and to two transverse axes of a closed or half-open space in which are generated radiofrequency electromagnetic fields and magnetic field gradients.

According to the invention, the device includes:
in a measurement case:
  a sensor for measuring radiofrequency magnetic fields including an assembly of radiofrequency coils for measuring the components of the radiofrequency magnetic fields along both transverse axes,
  a sensor for measuring magnetic field gradients including three assemblies of coils for measuring the magnetic field gradients respectively along the three measurement axes,
  a sensor for measuring the radiofrequency electric field including two independent electrically conducting wires mounted in an aligned way while being each surrounded by a material with strong relative dielectric permittivity,
  a stage for conditioning the electric signals delivered by the sensor for measuring the radiofrequency magnetic fields, by the sensor for measuring the magnetic field gradients, by the sensor for measuring the radiofrequency electric field,
  a stage for converting the electric signals delivered by the various measurement sensors into light signals,
  an electric power supply source for the conditioning and conversion stages,
a control unit for processing signals, connected to the stage for conditioning the measurement case via a beam for transmitting light signals, this unit including a stage for converting light signals into electric signals connected to means for synchronously controlling the acquisition of the electric signals delivered by the measurement sensors and corresponding to the electromotive forces generated by the different fields inside the space, means for displaying and/or recording electric signals delivered by the sensors.

Further, the device according to the invention may further have, as a combination, at least either one and/or both of the following additional features:

for the sensor for measuring the radiofrequency electric field, the material surrounding the conducting wires has a relative dielectric permittivity >50, the electrically conducting wires have substantially equal lengths and have at their neighboring ends, terminals for connecting to the conditioning stage, for the sensor for measuring the radiofrequency magnetic fields, the assembly of coils includes a flat coil with a butterfly shape and a flat coil extending parallel to the butterfly-shaped coil while being centered with respect to the latter, a sensor for measuring the main magnetic field and its variations including two coils of the Helmholtz type in order to measure the variations of the main magnetic field and a Hall Effect cell for evaluating the main magnetic field in amplitude and direction, the sensor for measuring the variations of the main magnetic field includes two coils included in a mounting cylinder in which also extend the three sets of coils of the sensor for measuring magnetic field gradients, the assembly of the flat radiofrequency coils of the sensor for measuring the radiofrequency magnetic fields being positioned inside the mounting cylinder, the electrically conducting wires of the sensor for measuring the radiofrequency electric field extend parallel with the axis of the mounting cylinder.

Another object of the invention is to propose a simple and reliable method for measuring the radiofrequency electromagnetic fields and the magnetic field gradients actually applied to an object to be examined by magnetic resonance.

In order to attain such a goal, the measurement method for measuring the radiofrequency electromagnetic fields and the magnetic field gradients generated inside a space allowing implementation of magnetic resonance applications on an object, consists:

of positioning inside the space in which the object of study is placed, the case of the measurement apparatus according to the invention, including sensors for measuring the image of the radiofrequency electromagnetic fields and of the magnetic field gradients applied onto the object, controlling upon occurrence in the sensors of the measurement apparatus of electromotive forces generated by the different fields applied onto the object, the synchronous acquisition of the measurements of the sensors of the measurement apparatus, and recording and/or displaying the radiofrequency magnetic fields, the magnetic field gradients and the radiofrequency electric field.

Further, the method according to the invention may further consist in a combination of at least either one and/or both of the following additional features:

from the measurement of the radiofrequency electric field, evaluating the specific energy dose, from conducted measurements, producing corrections of the obtained images or spectra, correcting by a trigonometric calculation, the values measured by the measurement sensors in order to replace them into the reference system of the main magnetic field.

Various other features will become apparent from the description made below with reference to the appended drawings which show, as non-limiting examples, embodiments of the object of the invention.

Figure 1:
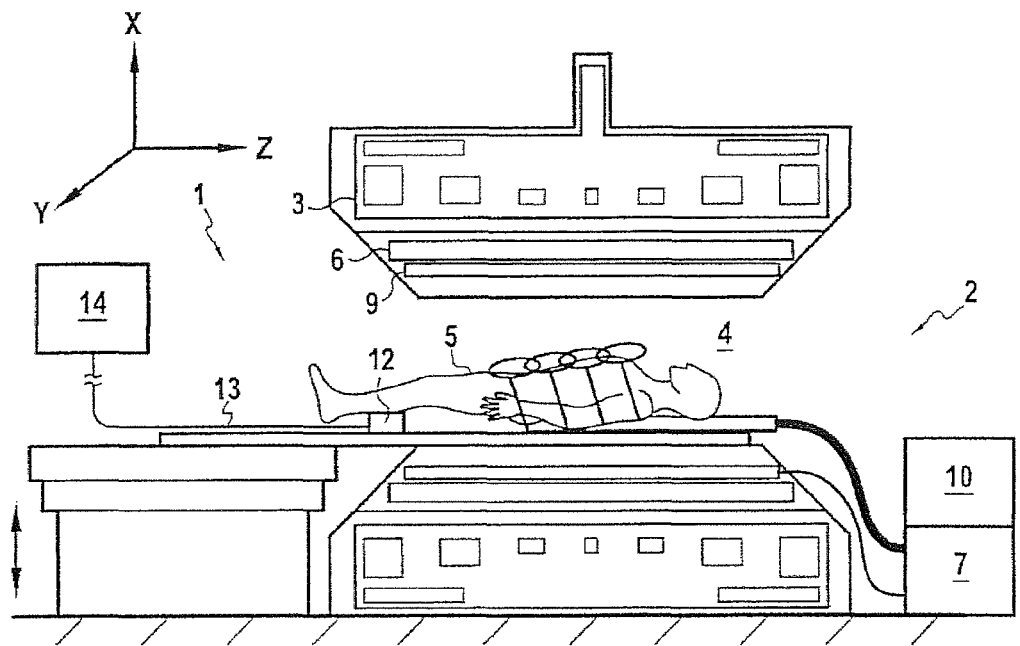
FIG. 1 is a block diagram of a magnetic resonance apparatus equipped with a measurement device according to the invention.

As this emerges from FIG. 1, the object of the invention relates to a measurement device 1 for a magnetic resonance apparatus 2, of all types known per se, such as NMR, MRI or MRS types. Conventionally, the magnetic resonance apparatus 2 includes a system of magnets 3 adapted for generating a main static magnetic field $B_0$ inside a space 4 in which is positioned an object 5 to be examined, such as a human or animal body.

The magnetic resonance apparatus 2 also includes gradient coils 6 powered by a power supply block 7, for generating three other magnetic fields having a gradient in the directions x, y, z defining a system of perpendicular coordinates. Thus, inside the space 5, magnetic field gradients are generated along the axes x, y and z.

The magnetic resonance apparatus 2 also includes one or several radiofrequency emitting coils 9 used for generating magnetic excitation RF pulses. This radiofrequency emitting coil 9 is conventionally connected to an emission circuit and to a control unit 10.

This magnetic resonance apparatus 2 has an architecture such that the space 4 which appears either as a closed space such as a tunnel including the longitudinal axis z along which the object 5 is placed, corresponds to the axis of the main magnetic field, or as a half-open space with transverse access in which the axis z of the main magnetic field principal is perpendicular to the object 5. The radiofrequency magnetic field $B_1$ for emission is perpendicular to the axis of the main magnetic field $B_0$ and may therefore be established according to either one or both transverse axes x or y. The magnetic resonance apparatus 2 is not described in a more detailed way since it is well known to the person skilled in the art and is not specifically part of the object of the invention.

In the illustration selected on the drawings, the most common illustration, the main axis of the object 5 to be examined is parallel to the axis of the main static magnetic field $B_0$. This arrangement conditions the geometry of the gradient coils 6, of the emitting and receiving coils 9 but also the geometry of the sensors according to the invention described hereafter. Of course, other configurations of magnetic resonance apparatuses exist which generate a magnetic field which is not collinear with the axis of the patient. In this case, the geometries are different as well as for the sensors according to the invention. However, from the description given in the continuation of the description, the person skilled in the art is able to transpose the description of the invention so as to adapt it to other configurations of magnetic resonance apparatuses.

As this more specifically emerges from FIG. 1, the measurement device 1 according to the invention includes a measurement case 12 intended to be placed inside the space 4 in which the object of study 5 is positioned. This measurement case 12 is connected via a transmission beam 13, to a control and signal processing 14 unit, located outside the space 4.

The measurement case 12 is adapted so as to measure an image of the electromagnetic fields generated inside the space 4.

Figure 3:
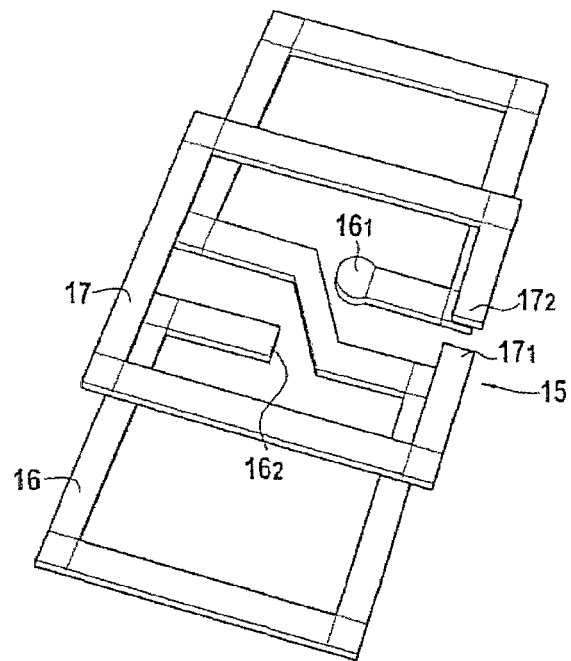
FIG. 3 illustrates an exemplary embodiment of a sensor for measuring radiofrequency magnetic fields.
Figure 2:
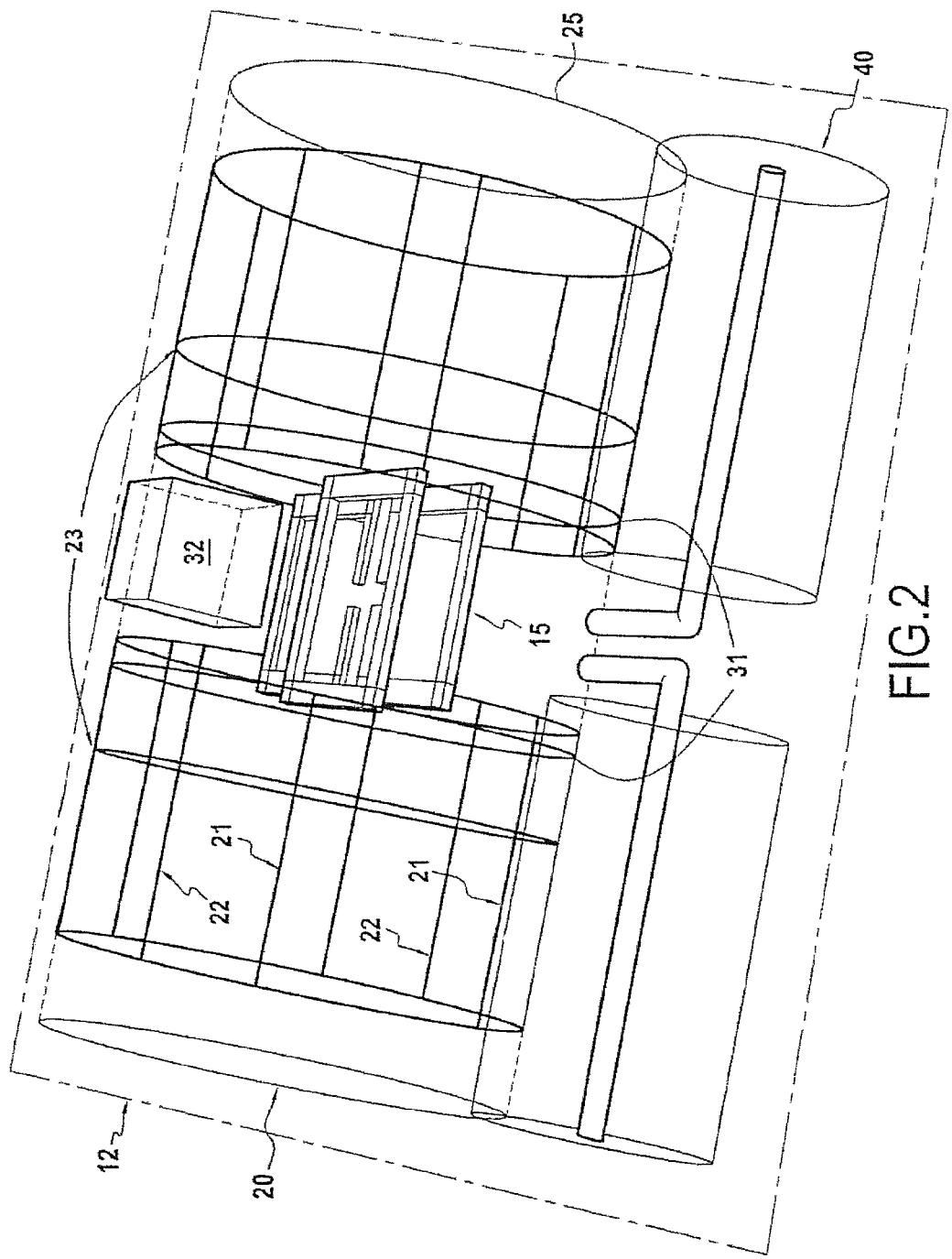
FIG. 2 illustrates in a perspective view an embodiment of the various measurement sensors of a measurement case belonging to the measurement device according to the invention.
Figure 4:
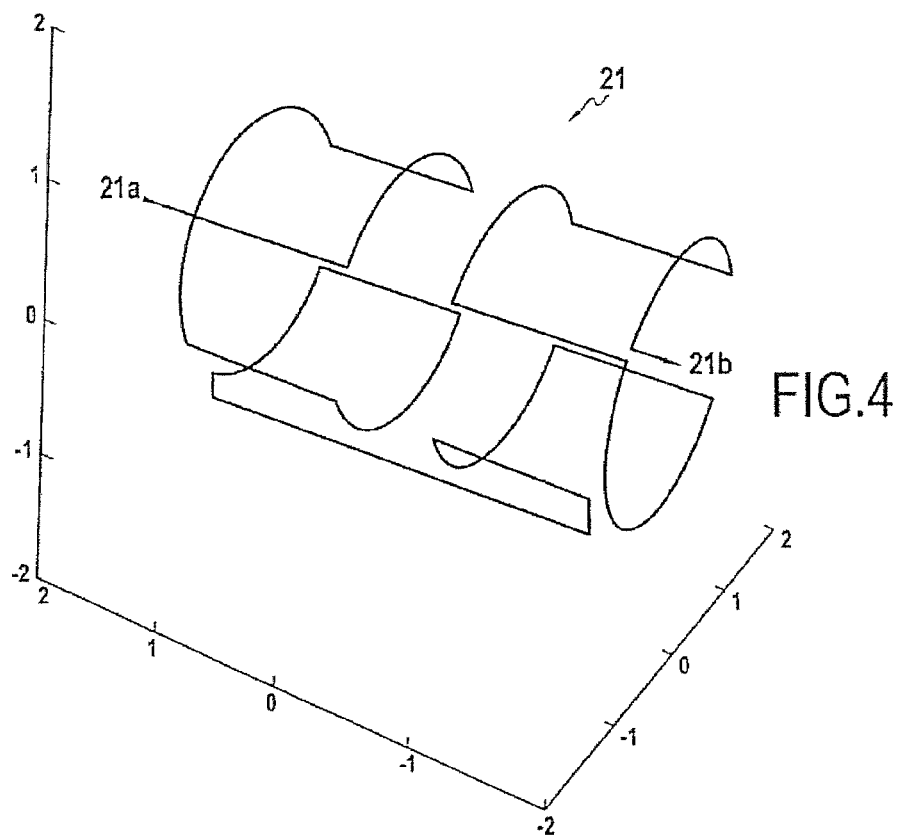
FIGS. 4 to 6 are perspective views illustrating coils for measuring magnetic field gradients along three different measurement axes.
Figure 5:
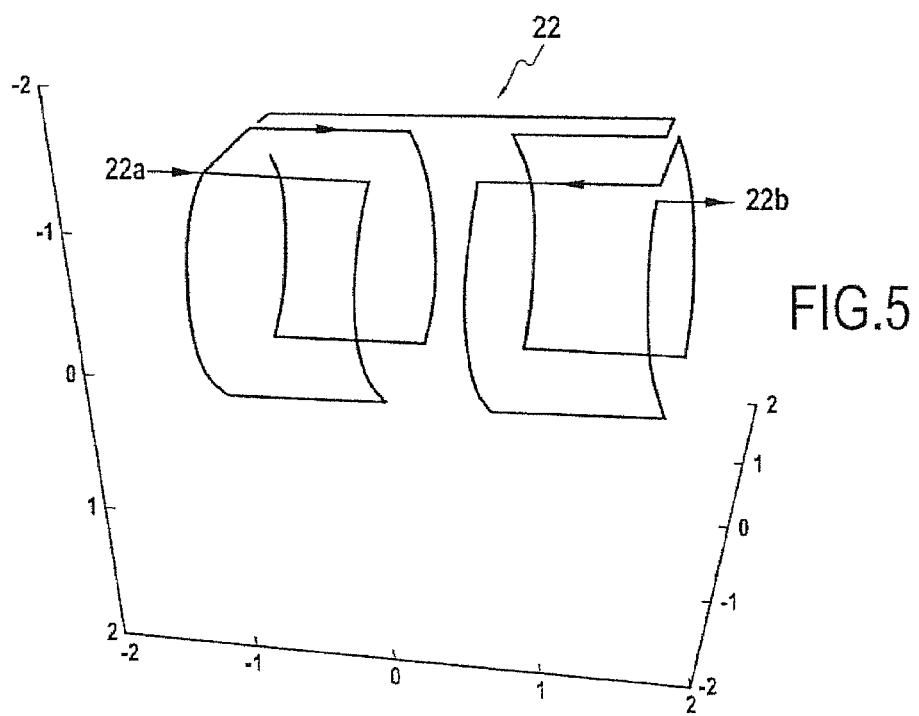

For this purpose, the measurement case 12 includes, as illustrated in FIGS. 2 and 3, a sensor 15 for measuring radiofrequency magnetic fields $B_1$ including an assembly of radiofrequency coils 16, 17 for measuring the magnetic components of the radiofrequency magnetic fields along both transverse axes x, y, i.e. in the plane x, y orthogonal to the axis z of the magnetic field $B_0$.

It should be noted that a simple loop placed in the radiofrequency emission coil which generates a field $B_1$ is the centre of an electromotive force e due to variation of the flux:

$$\varphi = B1 \cos[\omega t] S$$

$$e = \partial_t \varphi$$

For radiofrequency magnetic fields $B_1$ of a few µT and frequencies of the order of about hundred MHz ($\omega = 2\pi f$), a surface S of the order of 1 cm² gives the possibility of collecting tens of mV to a few V of radiofrequency signal. With a weaker field, the sensor may have several turns.

The generated radiofrequency magnetic fields $B_1$ are very often in quadrature so that two assemblies of coils 16, 17 therefore give the possibility of collecting both components of the emission field. In order to keep a planar geometry, the quadrature measurement may be ensured by means of a butterfly-shaped loop 16. Thus, the measurement sensor 15 may include a butterfly-shaped double flat coil 16 and a flat coil 17 extending parallel to the double coil, while being centered with respect to the latter. The double flat coil with the butterfly shape 16, has a first loop with a first connecting terminal $16_1$ located at one end of this first loop and, a second loop placed near and connected to the first loop, while having a second connecting terminal $16_2$ at the end of this second loop. The flat coil 17 is made as a loop provided at both of its ends placed side by side, with two connecting terminals $17_1$, $17_2$. The ratio of the surface areas of a simple coil and of a butterfly-shaped coil depends on the volume probed for measuring the radiofrequency magnetic field $B_1$.

The simple coil 17 and the butterfly-shaped coil 16 are superposed and perfectly centered (on a double-sided circuit for example) in order to avoid any crosstalk between both measurements. Making the coils 16, 17 with three turns of a regular shape each with a size of the order of 1 cm may be contemplated.

The measurement case 12 also includes a sensor 20 for measuring magnetic field gradients. This measurement sensor 20 includes as more particularly illustrated by FIGS. 2, 4, 5 and 6, three sets of coils 21, 22, 23 for measuring the magnetic field gradients along the three measurement axes x, y, z respectively. Thus, three sets of coils 21, 22, 23 are made for covering the three axes x, y, z.

The relatively low frequency of the magnetic field gradients imposes multiplication of the turns of the measurement coils for recovering sufficient voltage. The emission-reception reciprocity principle is put to use. The magnetic field gradients required for spatial localization of the signal in MRI or further for measurement of scattering coefficients in NMR are generated by coils with known geometries. In order to measure these field gradients, the three sets of coils are similar in reduction to the coils of gradients 6. The measurement sensor 20 intrinsically measures a magnetic field gradient, so that its position in the space is arbitrary from the moment that it is placed in a region in which the field gradient is generated and that its orientation is correct.

Figure 6:
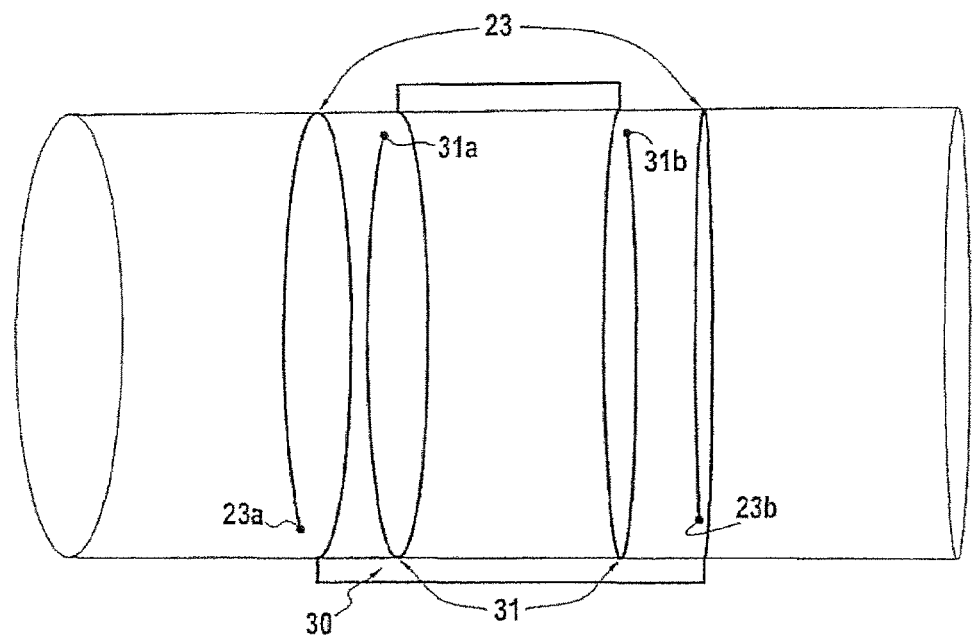

According to an exemplary embodiment illustrated in the drawings, the measurement sensor 20 includes:

a first set of coils 21 of the GOLAY type for measuring the gradient dBz/dy along the y axis, conventionally formed with two pairs of coils and having connecting terminals 21a, 21b (FIG. 4), a second set of coils 22 of the GOLAY type for measuring the gradient dBz/dx along the x axis, conventionally formed with two pairs of coils and having connecting terminals 22a, 22b (FIG. 5), a third set of coils 23 of the MAXWELL type for measuring the gradient dBz/dz along the z axis formed with two coils connected in series and having connecting terminals 23a, 23b (FIG. 6).

According to a preferred alternative embodiment illustrated in FIG. 2, the three sets of coils 21, 22, 23 are mounted so as to be included in a mounting cylinder 25. Advantageously, the assembly of flat radiofrequency coils of the sensor 15 for measuring radiofrequency magnetic fields is positioned inside the mounting cylinder 25.

According to a preferred embodiment feature, the measurement case 12 includes a sensor 30 for measuring the main magnetic field $B_0$ and its variations. This sensor 30 thus includes two coils of the Helmholtz type 31 (FIGS. 2 and 6) for measuring the variations of the main magnetic field $B_0$ and a Hall Effect cell 32 for evaluating the main magnetic field $B_0$ in amplitude and in direction. Both coils of the Helmholtz type 31 are mounted in series and have connecting terminals 31a, 31b. Advantageously, both coils 31 for measuring the variations of the main magnetic field are also included in the mounting cylinder 25. Also, the Hall Effect cell 32 is mounted inside the mounting cylinder 25 and its orientation is specifically defined with respect to those of the sensors 15, 20, 30 and 40. The Hall Effect cell 32 thus gives the possibility of measuring the amplitude of the main magnetic field $B_0$ and therefore inferring therefrom the working frequency of the apparatus for adapting the amplification of the signals from the measurement sensors 15 and 40 in connection with their transfer functions. Moreover, by knowing both angles (azimuth and elevation) of the whole of the measurement sensors with respect to the axis of the main magnetic field $B_0$ of the apparatus, it is possible to correct by a simple trigonometric calculation the values measured by these sensors in order to replace them into the reference system of the main magnetic field $B_0$ or to modify the alignment of the whole of the measurement system in order to align it with the main magnetic field $B_0$.

Figure 7:
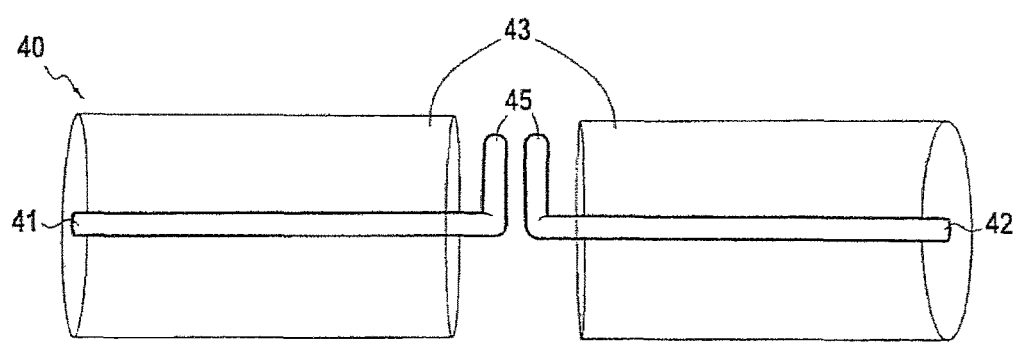
FIG. 7 is a view of an exemplary embodiment of a sensor for measuring the radiofrequency electric field.

The measurement case 12 also includes a sensor 40 for measuring the radiofrequency electric field. This sensor 40 measures the electric fields generated in the space 4 by the radiofrequency magnetic field generated for switching the nuclear magnetization. As illustrated in FIG. 7, this measurement sensor 40 includes two independent electrically conducting wires 41, 42 mounted in an aligned way, each being surrounded by a material with strong relative dielectric permittivity 43. Advantageously, the material surrounding the conducting wires 41, 42 has a relative dielectric permittivity >50.

Thus, for a given frequency of the electric field, the associated wavelengths:

$$\lambda = \lambda_0/(\cdot \varepsilon_r)^{1/2}$$

in the sensor are much shorter than those λ0 of the field in air and therefore give the possibility of efficiently measuring the local electric field with a sensor of reduced dimensions.

From among the materials with strong permittivity, the most simple is water, the relative permittivity of which is of the order of 80 at the relevant frequencies. Water in liquid form is difficult to use for obvious practical reasons. Gelling this water by means of agar-agar is proposed. The water and agar-agar solution (at a few percent) as well as a minute amount of preservative ($NaN_3$ for example) is brought to a temperature of 80° C., cooling down to room temperature provides a solid gel into which are inserted the electric conductors 41, 42 such as copper strands.

Advantageously, the measurement sensor 40 is mounted in the case so that the electrically conducting wires 41, 42 of the sensor for measuring the radiofrequency electric field extend parallel to the axis of the mounting cylinder 25.

Advantageously, the electrically conducting wires 41, 42 are of substantially equal lengths. These conductive wires 41, 42 have at their neighboring ends, terminals 45, for connecting to a conditioning stage not shown but integrated into the interior of the case 12.

This stage allows conditioning of the electric signals delivered by the different measurement sensors, i.e. by the sensor 15 for measuring the radiofrequency magnetic fields, by the sensor 20 for measuring the magnetic field gradients, by the sensor 30 for measuring the main magnetic field and its variations and by the sensor 40 for measuring the radiofrequency electric field.

The measurement case 12 also includes a stage for converting the electric signals delivered by the various measurement sensors 15, 20, 30, 40 into light signals. Of course, the measurement case 12 includes an electric power supply source for the conditioning and conversion stages. As an example, the measurement case 12 has reduced dimensions of the order of a length of 12 cm, a width of 8 cm, a height of 4 cm.

The measurement light signals are conveyed via the transmission beam 13 to the control and processing unit 14 without being subject to perturbations related to the fields generated inside the space 4. The control and processing unit 14 is placed in any suitable location outside the space 4.

This control and processing unit 14 includes a stage for converting light signals into electric signals, connected to means for synchronously controlling the acquisition of the electric signals delivered by the measurement sensors.

It should be considered that the measurement case 12 is passive in the sense that the measurements are only conducted from the occurrence in either one and/or both of the measurement sensors, of an electromotive force generated by the different fields.

This control and processing unit 14 includes means for recording and/or displaying electric signals delivered by the sensors. Thus, this unit 14 allows recording and/or displaying of the measurements of the radiofrequency magnetic field, of the magnetic field gradients along the three axes, of the radiofrequency electric field and/or of the main magnetic field and its variations.

From the foregoing description, it emerges that the measurement device 1 according to the invention gives the possibility of measuring in a homothetic way, directly inside the space 4 in which the object to be examined is positioned, the various fields generated by a magnetic resonance apparatus 2.

The application of the measurement device 1 according to the invention directly results from the foregoing description.

The measurement case 12 is placed inside the space 4, for example in proximity to the object 5 to be examined. It should be noted that the reduced size of the measurement case 12 allows its positioning inside the space 4 while the object 5 is also placed inside the space 4.

It is recalled that this measurement case 12 is passive so that a measurement is only conducted during the operation of the magnetic resonance apparatus 2 which generates inside the space 4, radiofrequency electromagnetic fields and magnetic field gradients.

During the generation of such fields by the magnetic resonance apparatus 2, electromotive forces are generated in either one and/or both of the measurement sensors of the measurement case 1. As soon as an electromotive force occurs, the control unit 14 synchronously controls the various measurement sensors of the measurement case 12 in order to measure the corresponding signals according to a time base. These various signals are displayed and/or recorded so as to determine, by a homothetic measurement, the radiofrequency magnetic fields, the magnetic field gradients and the radiofrequency electric field.

These measurements allow synchronous and real-time determination of the whole of the radiofrequency fields, of the magnetic field gradients and of the main field actually created in the NMR spectroscopic and/or imaging apparatus during the examination. This information is useful in many applications: during the development of an imaging or spectroscopy sequence, a company developing imaging apparatuses or researchers for decoding the complete sequence of the fields used for generating the image or the sought NMR spectrum and rapidly and efficiently controlling proper application of the sequence. From specifically knowing the actually applied fields (effective sweeping of space k, for example), corrections of the images or of the obtained spectra may if necessary be contemplated.

Also, the measurement of the radiofrequency electric field, gives the possibility of evaluating the specific energy dose (SAD or SAR: Specific Absorption Rate) developed by the sequence according to techniques known to the person skilled in the art.

The invention is not limited to the examples described and illustrated since diverse modifications may be brought thereto without departing from its scope.

The invention claimed is:

1. A measurement device for magnetic resonance applications, including three measurement axes (x, y, z) corresponding to the axis (3) of a main magnetic field and to two transverse axes (x, y) of a closed or half-open space (4) in which are generated radiofrequency electromagnetic fields and magnetic field gradients, the measurement device comprising
    in a measurement case (12):
    a sensor (15) for measuring radiofrequency magnetic fields including an assembly of radiofrequency coils (16, 17) for measuring the components of the radiofrequency magnetic fields along both transverse axes (x, y),
    a sensor (20) for measuring magnetic field gradients including three sets of coils (21, 22, 23) for measuring the magnetic field gradients along the three measurement axes (x, y, z) respectively, a sensor (40) for measuring the radiofrequency electric field including two independent electrically conducting wires (41, 42) mounted in an aligned way, each being surrounded by a material with strong relative dielectric permittivity (43), a stage for conditioning the electric signals delivered by the sensor (15) for measuring radiofrequency magnetic fields, by the sensor (20) for measuring magnetic field gradients, by the sensor for measuring the radiofrequency electric field (40), a stage for converting the electric signals delivered by the various measurement sensors, into light signals, an electric power supply source of the conditioning and conversion stages, a controller (14) for controlling and processing the signals, connected to the stage for conditioning the measurement case (12) via a beam for transmitting light signals (13), this unit including a stage for converting light signals into electric signals connected to means for synchronously controlling the acquisition of the electric signals delivered by the measurement sensors and corresponding to the electromotive forces generated by the various fields inside the space (4), a monitor for displaying the electric signals delivered by the sensors and/or a memory in the controller for recording the electric signals delivered by the sensors.

2. The measurement device according to claim 1, wherein for the sensor for measuring the radiofrequency electric field (40), the material (43) surrounding the conductive wires (41, 42) has a relative dielectric permittivity >50.

3. The measurement device according to claim 1, wherein the electrically conducting wires (41, 42) are of substantially equal lengths and have at neighboring ends thereof, terminals (45) for connecting to the conditioning stage.

4. The measurement device according to claim 1, wherein for the sensor (15) for measuring the radiofrequency magnetic fields, the assembly of coils includes a flat coil with a shape of a butterfly (16) and a flat coil (17) extending parallel to the butterfly-shaped coil while being centered with respect to the latter.

5. The measurement device according to claim 1, further comprising a sensor (30) for measuring the main magnetic field and its variations including two coos of the Helmholtz type (31) for measuring the variations of the main magnetic field ($B_0$) and a Hall Effect cell (32) for evaluating the main magnetic field ($B_0$) in amplitude and direction.

6. The measurement device according to claim 5, wherein the sensor (30) for measuring the variations of the main magnetic field includes two coils (31) included in a mounting cylinder (25) in which also extend the three sets of coils (21, 22, 23) of the sensor (20) for measuring magnetic field gradients, the assembly of the flat radiofrequency coils of the measurement sensor (15) for the radiofrequency magnetic fields being positioned inside the mounting cylinder.

7. The measurement device according to claim 6, wherein the electrically conducting wires (41, 42) of the measurement sensor (40) for the radiofrequency electric field extend parallel to the axis of the mounting cylinder.

8. A method for measuring radiofrequency electromagnetic fields and magnetic field gradients generated inside a space (4) allowing the application of magnetic resonance applications on an object (5), the method comprising:

positioning inside the space (4) in which the object of study (5) is placed, the case (12) of the measurement device (1) according to claim 1, including sensors (15, 20, 40) for measuring the image of the radiofrequency electromagnetic fields and of the magnetic field gradients applied on the object (5), controlling during the occurrence in the sensors of the measurement device (1), electromotive forces generated by the various fields applied on the object, synchronous acquisition of the measurements of the sensors of the measurement apparatus, and of recording, via the memory in the controller of the measurement device (1) according to claim 1, the radiofrequency magnetic fields, the magnetic field gradients and the radiofrequency electric field and/or displaying, via the monitor of the measurement device (1) according to claim 1, the radiofrequency magnetic fields, the magnetic field gradients and the radiofrequency electric field.

9. The measurement method according to claim 8, comprising evaluating a specific energy dose from the measurement of the radiofrequency electric field.

10. The measurement method according to claim 9, comprising producing corrections of obtained images or spectra from the conducted measurements.

11. The measurement method according to claim 8, comprising correcting by a trigonometric calculation, values measured by the measurement sensors in order to replace values in a reference system of the main magnetic field ($B_0$).

* * * * *